(12) United States Patent
Lai et al.

(10) Patent No.: US 11,069,774 B2
(45) Date of Patent: Jul. 20, 2021

(54) SHALLOW TRENCH ISOLATION STRUCTURE AND SEMICONDUCTOR DEVICE WITH THE SAME

(71) Applicant: Fujian Jinhua Integrated Circuit Co., LTD., Jinjiang (CN)

(72) Inventors: Huixian Lai, Jinjiang (CN); Yu Cheng Tung, Jinjiang (CN); Chao-Wei Lin, Jinjiang (CN); Chiayi Chu, Jinjiang (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/696,765

(22) Filed: Nov. 26, 2019

(65) Prior Publication Data
US 2021/0098571 A1 Apr. 1, 2021

(30) Foreign Application Priority Data

Sep. 26, 2019 (CN) .......................... 201910919266.9
Sep. 26, 2019 (CN) .......................... 201921620570.5

(51) Int. Cl.
*H01L 29/06* (2006.01)
(52) U.S. Cl.
CPC ................. *H01L 29/0649* (2013.01)
(58) Field of Classification Search
CPC . H01L 29/0649; H01L 21/76205–7621; H01L 21/76224–76237; H01L 21/76283–76286; H01L 29/7846; H01L 21/823481; H01L 21/823878

USPC .......................................................... 257/506
See application file for complete search history.

(56) References Cited

U.S. PATENT DOCUMENTS

| | | | | |
|---|---|---|---|---|
| 6,255,194 | B1* | 7/2001 | Hong | H01L 21/76224 |
| | | | | 257/E21.546 |
| 6,709,924 | B1* | 3/2004 | Yu | H01L 21/76232 |
| | | | | 257/E21.549 |
| 7,795,110 | B2* | 9/2010 | Youn | H01L 21/76224 |
| | | | | 438/437 |
| 8,766,355 | B2* | 7/2014 | Lee | H01L 27/10873 |
| | | | | 257/330 |
| 9,525,042 | B2 | 12/2016 | Won et al. | |
| 9,985,034 | B2 | 5/2018 | Yoon et al. | |
| 2002/0048887 | A1* | 4/2002 | Hwang | H01L 21/76224 |
| | | | | 438/296 |
| 2004/0072408 | A1* | 4/2004 | Yun | H01L 21/76224 |
| | | | | 438/435 |

(Continued)

*Primary Examiner* — Mohammad M Hoque
(74) *Attorney, Agent, or Firm* — Winston Hsu

(57) ABSTRACT

A shallow trench isolation structure and a semiconductor device. The shallow trench isolation structure includes a substrate; at least one trench located at a top surface of the substrate; and a first dielectric layer, a second dielectric layer and a third dielectric layer that are sequentially stacked on an inner wall of each of the at least one trench. A topmost surface of the first dielectric layer is lower than a topmost surface of the second dielectric layer and the top surface of the substrate, to form a first groove between the second dielectric layer and the substrate. An edge corner between the top surface of the substrate and the inner wall of each of the at least one trench is in a shape of a fillet curve. The fillet structure is smooth and round without a sharp corner, reducing point discharge and improving reliability of the shallow trench isolation structure.

19 Claims, 8 Drawing Sheets

(56) References Cited

U.S. PATENT DOCUMENTS

| | | | |
|---|---|---|---|
| 2005/0009294 A1* | 1/2005 | Piccolo | H01L 21/76229 438/424 |
| 2005/0167778 A1* | 8/2005 | Kim | H01L 21/76224 257/510 |
| 2006/0079068 A1* | 4/2006 | Sheu | H01L 28/40 438/433 |
| 2007/0164391 A1* | 7/2007 | Youn | H01L 21/76224 257/510 |
| 2010/0129983 A1* | 5/2010 | Park | H01L 21/76232 438/435 |
| 2010/0237432 A1* | 9/2010 | Takeoka | H01L 21/76237 257/369 |
| 2015/0228741 A1* | 8/2015 | Wang | H01L 27/11521 257/316 |
| 2016/0064228 A1* | 3/2016 | van Bentum | H01L 27/11592 257/295 |
| 2018/0331220 A1 | 11/2018 | Sung et al. | |

* cited by examiner

SHALLOW TRENCH ISOLATION STRUCTURE AND SEMICONDUCTOR DEVICE WITH THE SAME

CROSS-REFERENCE TO RELATED APPLICATIONS

The application claims the priorities to Chinese patent application No. 201910919266.9 titled "SHALLOW TRENCH ISOLATION STRUCTURE AND SEMICONDUCTOR DEVICE WITH THE SAME", filed with the China National Intellectual Property Administration on Sep. 26, 2019, and Chinese patent application No. 201921620570.5 titled "SHALLOW TRENCH ISOLATION STRUCTURE AND SEMICONDUCTOR DEVICE WITH THE SAME", filed with the China National Intellectual Property Administration on Sep. 26, 2019, both of which are incorporated herein by reference in their entireties

THE FIELD OF THE INVENTION

The present disclosure relates to the technical field of semiconductor device, and in particular, to a shallow trench isolation structure and a semiconductor device with the shallow trench isolation structure.

BACKGROUND OF THE INVENTION

A requirement on a performance of device isolation is increasing with continuous development of semiconductor manufacturing technique. Shallow trench isolation (STI) technology is developed on such requirement. Namely, isolation is achieved by a shallow trench isolation structure fabricated in an isolation device, and an insulator is filled in the shallow trench isolation structure to insulate a device to be isolated. At present, the shallow trench isolation structure plays an important role in fabricating a semiconductor chip. Capable to achieve high-density isolation, the shallow trench isolation structure is widely used in a high-density semiconductor device, such as a deep-submicron device and a memory. The shallow trench isolation structure has many advantages, and it is necessary to improve reliability of the shallow trench isolation structure at present.

BRIEF SUMMARY

In view of the above, a shallow trench isolation structure and a semiconductor device with the shallow trench isolation are provided according to embodiments of the present disclosure. Technical problem in conventional technology are effectively addressed. Point discharge at the shallow trench isolation structure is reduced, and reliability of the shallow trench isolation structure is improved.

In order to achieve the above object, following technology solutions are provided according to embodiments of the present disclosure.

A shallow trench isolation structure is provided, including: a substrate; at least one trench in the substrate; and a first dielectric layer, a second dielectric layer and a third dielectric layer that are sequentially stacked on an inner wall of each of the at least one trench, and a first groove between the second dielectric layer and the substrate. A topmost surface of the first dielectric layer is lower than a topmost surface of the second dielectric layer and a top surface of the substrate. An edge corner between the top surface of the substrate and the inner wall of each of the at least one trench is in a shape of a fillet curve.

In one embodiment, the shallow trench isolation structure further includes a fourth dielectric layer located on an inner wall of the first groove.

In one embodiment, the fourth dielectric layers at adjacent ones of the at least one trenches abut with each other, covering the top surface of the substrate.

In one embodiment, the shallow trench isolation structure further includes a fifth layer at the first groove. The fifth layer is located in a groove formed by an inner wall of the fourth dielectric layer.

In one embodiment, the fifth layer and the second dielectric layer are made of a same material.

In one embodiment, the shallow trench isolation structure further includes a polysilicon layer located on a side away from the substrate of the fourth dielectric layer. The fifth layer and the polysilicon layer are made of a same material.

In one embodiment, a top surface of the third dielectric layer is recessed, and a bottom of the recessed top surface of the third dielectric layer is lower than the topmost surface of the second dielectric layer.

A semiconductor device is further provided, including: a substrate; at least one trench in the substrate; and a first dielectric layer, a second dielectric layer and a third dielectric layer that are sequentially stacked on an inner wall of each of the at least one trench, and a first groove between the second dielectric layer and the substrate. A topmost surface of the first dielectric layer is lower than a topmost surface of the second dielectric layer and the top surface of the substrate. An edge corner between the top surface of the substrate and the inner wall of each of the at least one trench is in a shape of a fillet curve.

In one embodiment, the semiconductor device further includes a fourth dielectric layer provided located on an inner wall of the first groove.

In one embodiment, the fourth dielectric layers at adjacent ones of the at least one trenches abut with each other, covering the top surface of the substrate.

In one embodiment, the semiconductor device further includes a fifth layer at the first groove. The fifth layer is located in a groove formed by an inner wall of the fourth dielectric layer.

In one embodiment, the fifth layer and the second dielectric layer are made of a same material.

In one embodiment, the semiconductor device further includes a polysilicon layer located on a side away from the substrate of the fourth dielectric layer. The fifth layer and the polysilicon layer are made of a same material.

In one embodiment, the polysilicon layer covers the topmost surface of the second dielectric layer and a part of a top surface of the third dielectric layer.

In one embodiment, a surface of the polysilicon layer above the at least one trench is lower than a surface of the polysilicon layer above the top surface of the substrate.

In one embodiment, the polysilicon layers at adjacent ones of the at least one trench abut with each other, covering a corresponding region of the top surface of the substrate.

In one embodiment, a top surface of the third dielectric layer is recessed, and a bottom of the recessed top surface of the third dielectric layer is lower than the topmost surface of the second dielectric layer.

In one embodiment, the semiconductor device includes at least one stacked structure. Each of the at least one stacked structure includes at least a first wiring layer, a second wiring layer, and a hard mask layer that are sequentially stacked above the substrate. Each of the at least one stacked structure is provided with an opening exposing at least a part of the top surface of the third dielectric layer.

In one embodiment, a surface of the first wiring layer above the at least one trench is lower than a surface of the first wiring layer above the top surface of the substrate. A surface facing away from the substrate of the hard mask layer is coplanar among the at least one stacked structure.

Compared with conventional technology, the technical solutions according to embodiments of the present disclosure achieve at least following advantages.

The shallow trench isolation structure and the semiconductor device are provided, including: the substrate; the at least one trench in the substrate; and the first dielectric layer, the second dielectric layer and the third dielectric layer that are sequentially stacked on the inner wall of each of the at least one trench. The topmost surface of the first dielectric layer is lower than the topmost surface of the second dielectric layer and a top surface of the substrate, to form the first groove between the second dielectric layer and the substrate. The edge corner between the top surface of the substrate and the inner wall of each of the at least one trench is in the shape of the fillet curve. It can be seen that according to the aforementioned technical solutions, an edge of the trench at the top surface of the substrate is a fillet structure, so that such edge is smooth and round without a sharp corner. Thereby, point discharge at the shallow trench isolation structure is reduced, and reliability of the shallow trench isolation structure is improved.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

Hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

As described in the background, the shallow trench isolation structure plays an important role in fabricating a semiconductor chip at present. Since it is capable to achieve high-density isolation, the shallow trench isolation structure is widely used in a high-density semiconductor device such as a deep-submicron device and a memory. The shallow trench isolation structure has many advantages, and it is necessary to improve reliability of the shallow trench isolation structure at present.

In view of the above, a shallow trench isolation structure and a semiconductor device are provided according to embodiments of the present disclosure. Technical problem in conventional technology are effectively addressed. Point discharge at the shallow trench isolation structure is reduced, and reliability of the shallow trench isolation structure is improved. In order to achieve the above object, following technology solutions are provided according to embodiments of the present disclosure. The technical solutions are described in detail in conjunction with FIGS. 1 to 8.

Figure 1:
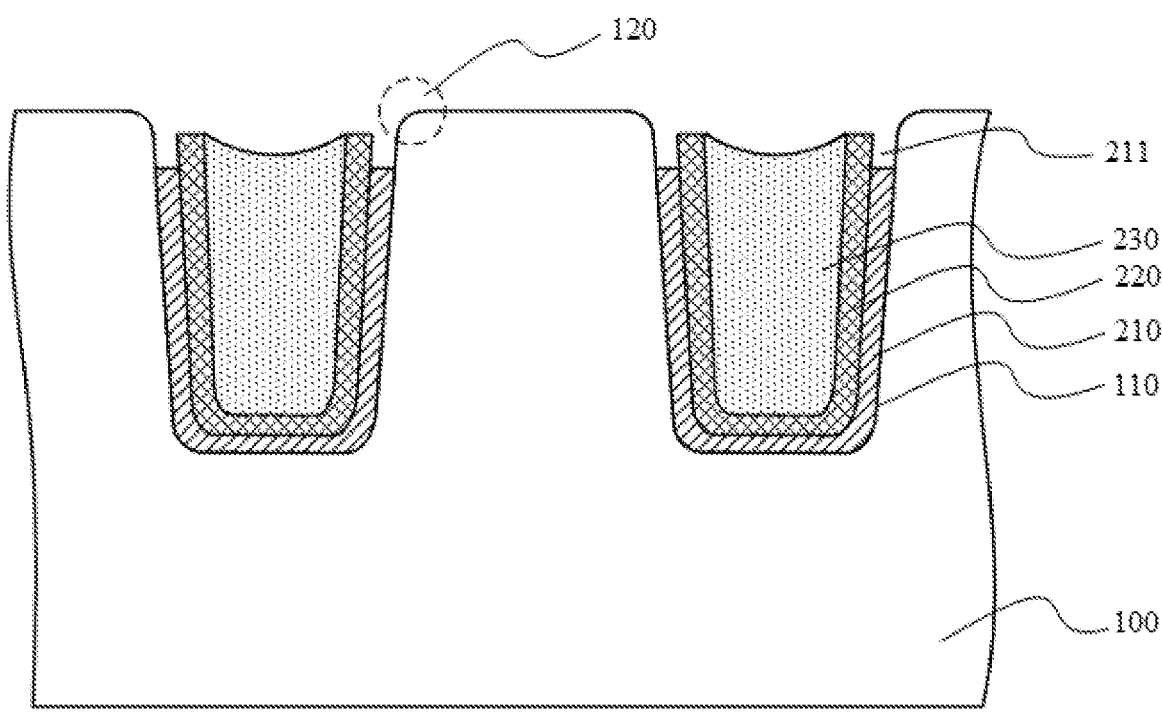
FIG. 1 is a schematic cross-sectional view of a shallow trench isolation structure according to an embodiment of the present disclosure.

Reference is made to FIG. 1, which is a schematic cross-sectional view of a shallow trench isolation structure according to an embodiment of the present disclosure. The shallow trench isolation structure includes: a substrate 100; at least one trench 110 located in the substrate 100; and a first dielectric layer 210, a second dielectric layer 220 and a third dielectric layer 230 that are sequentially stacked on an inner wall of each of the at least one trench 110. A topmost surface of the first dielectric layer 210 is lower than a topmost surface of the second dielectric layer 220 and a top surface of the substrate 100, to form a first groove 211 between the second dielectric layer 220 and the substrate 100. An edge corner between the top surface of the substrate 100 and the inner wall of each of the at least one trench 110 is in a shape of a fillet curve 120.

In one embodiment, a first dielectric layer and a second dielectric layer that are flush at the top may be formed in fabricating the shallow trench isolation structure. Then, the topmost surface of the first dielectric layer is etched to form the first groove. The edge corner between the top surface of the substrate and the inner wall of each trench may also be etched in etching the first dielectric layer, so that the first groove and the fillet curve at the edge corner between the top surface of the substrate and the inner wall of each trench are fabricated in a same process. Thereby, a fabrication process can be simplified, and a fabrication cost can be reduced.

It should be noted that herein a process of fabricating the fillet structure of the edge corner between the top surface of the substrate and the inner wall of each trench is not limited to the aforementioned process. In another of the present disclosure, the first groove and the fillet curve at the edge corner between the top surface of the substrate and the inner wall of each trench may be separately fabricated. The present disclosure is not limited thereto, and a specific process may be designed according to a practical application.

In one embodiment, the topmost surface of the first dielectric layer 210, the topmost surface of the second dielectric layer 220, and a top surface of the third dielectric layer 230 are all lower than the top surface of the substrate 100. The present disclosure is not limited thereto.

According to embodiments of the present disclosure, an edge of the trench at the top surface of the substrate is a fillet structure, so that such edge is smooth and round without a sharp corner. Thereby, point discharge of the shallow trench isolation structure is reduced at an edge on the top surface of the substrate, and reliability of the shallow trench isolation structure is improved.

In one embodiment, the substrate may be a silicon substrate, the first dielectric layer may be an oxide dielectric layer, the second dielectric layer may be a nitride dielectric layer, and the third dielectric layer may be an oxide dielectric layer. The present disclosure is not limited thereto. In another embodiment, the substrate, the first dielectric layer, the second dielectric layer, and the third dielectric layer may be made of other materials.

Figure 2:
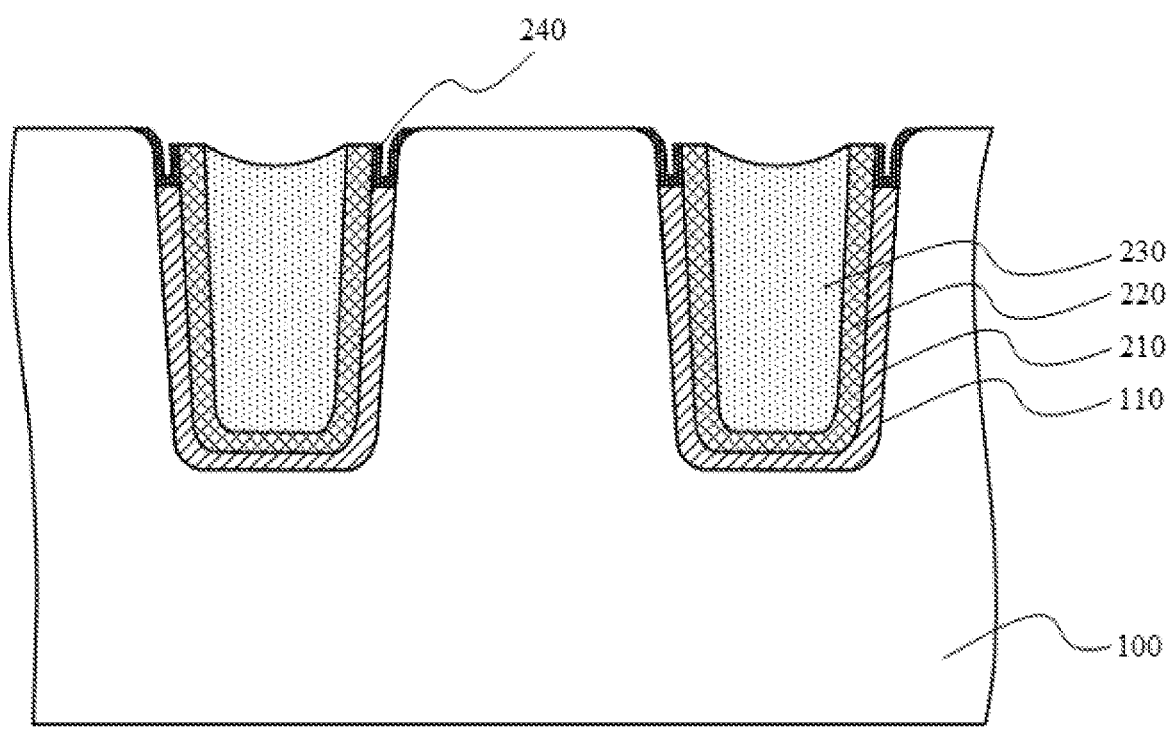
FIG. 2 is a schematic cross-sectional view of another shallow trench isolation structure according to an embodiment of the present disclosure.

Reference is made to FIG. 2, which is a schematic cross-sectional view of another shallow trench isolation structure according to an embodiment of the present disclosure. The shallow trench isolation structure in one embodiment further includes a fourth dielectric layer 240 located on an inner wall of the first groove 211.

The fourth dielectric layer is formed along the inner wall of the first groove in the shallow trench isolation structure. Since the first groove is located at the edge corner between the top surface of the substrate and the inner wall of each trench, the fourth dielectric layer is overlapped with the edge corner. Thereby, the fourth dielectric layer covers at least a part of the edge corner between the top surface of the substrate and the inner wall of each trench. The point discharge of the shallow trench isolation structure is further reduced at the edge on the top surface of the substrate, and the reliability of the shallow trench isolation structure is further improved.

Figure 3:
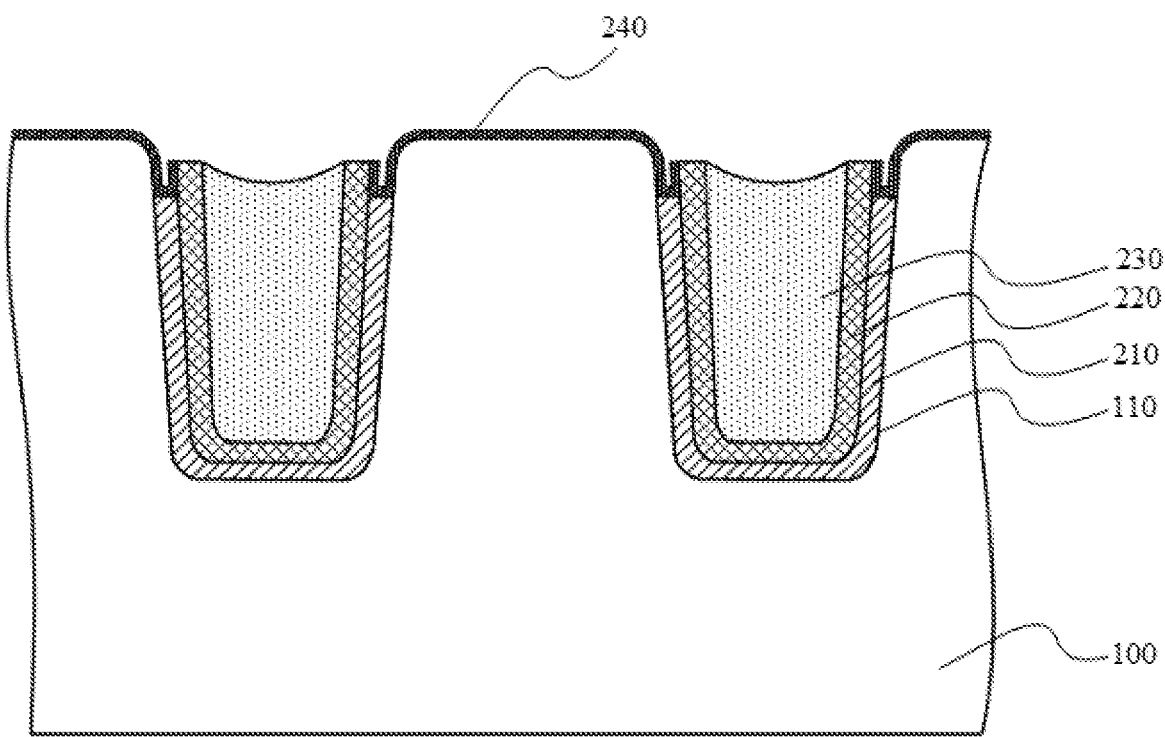
FIG. 3 is a schematic cross-sectional view of another shallow trench isolation structure according to an embodiment of the present disclosure.

Reference is further made to FIG. 3, which is a schematic cross-sectional view of another shallow trench isolation structure according to an embodiment of the present disclosure. The fourth dielectric layers 240 of adjacent trenches 110 abut with each other, covering the top surface of the substrate 100.

In one embodiment, the fourth dielectric layer may be a gate oxide layer. The present disclosure is not limited thereto. In another embodiment, the fourth dielectric layer may be made of polysilicon.

The fourth dielectric layer covers the top surface of the substrate between the adjacent trenches when being fabricated in the first groove, and thereby it is not necessary to separately fabricate a dielectric layer covering the top surface of the substrate. A fabrication process of the shallow trench isolation structure is simplified, and a fabrication cost is reduced.

It should be noted that, in another embodiment, the fourth dielectric layer and the dielectric layer on the top surface of the substrate may be separately fabricated. The present disclosure is not limited thereto, and a specific process may be designed according to a practical application.

Figure 4:
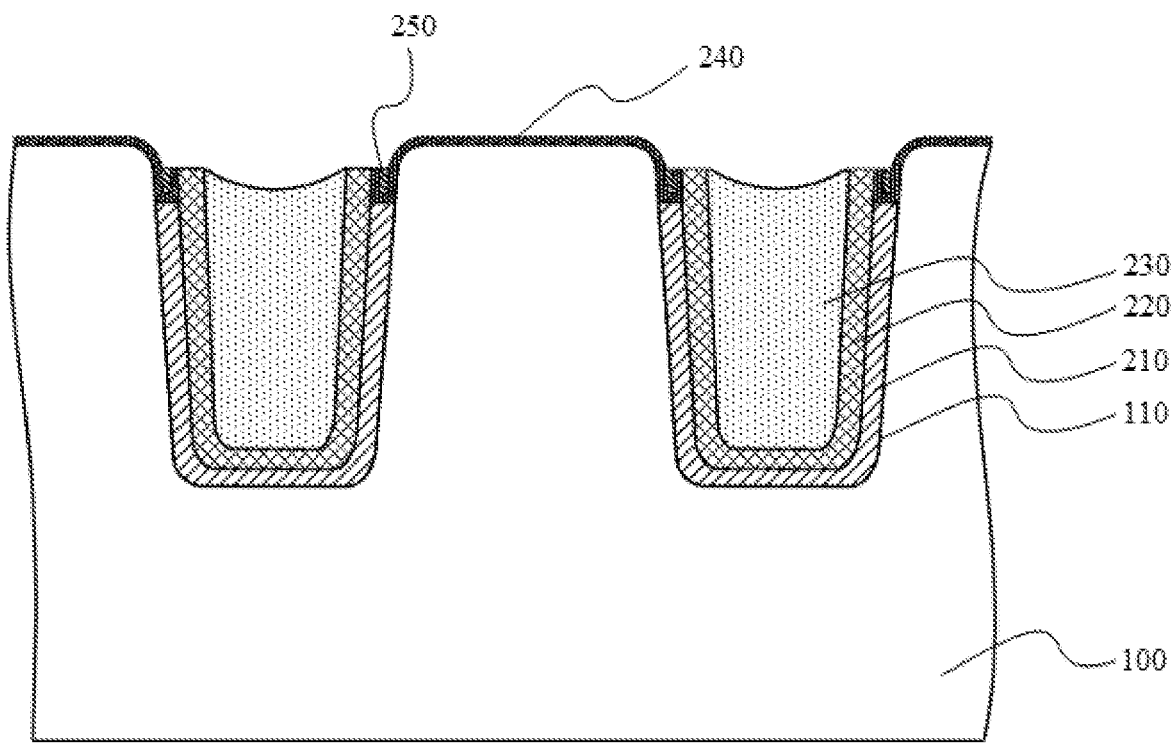
FIG. 4 is a schematic cross-sectional view of another shallow trench isolation structure according to an embodiment of the present disclosure.

Reference is made to FIG. 4, which is a schematic cross-sectional view of another shallow trench isolation structure according to an embodiment of the present disclosure. The shallow trench isolation structure further includes a fifth layer 250 at the first groove 211, and the fifth layer 250 is located in a groove formed by an inner wall of the fourth dielectric layer 240.

In one embodiment, the fifth layer and the second dielectric layer may be made of a same material. The present disclosure is not limited thereto.

Figure 5:
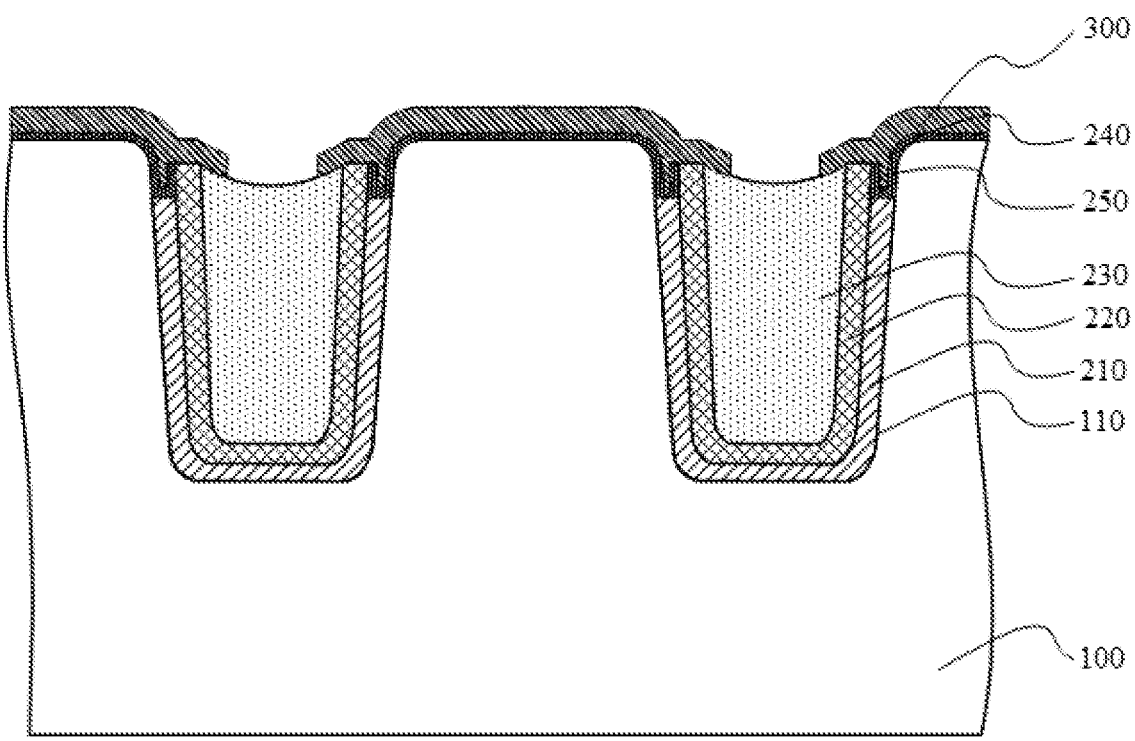
FIG. 5 is a schematic cross-sectional view of another shallow trench isolation structure according to an embodiment of the present disclosure.

An alternative is shown in FIG. 5, which is a schematic cross-sectional view of another shallow trench isolation structure according to an embodiment of the present disclosure. The shallow trench isolation structure further includes a polysilicon layer 300 located on a side away from the substrate of the fourth dielectric layer 240. The fifth layer 250 and the polysilicon layer 300 are made of a same material.

In one embodiment, the shallow trench isolation structure includes the polysilicon layer located on the side facing away from the substrate of the fourth dielectric layer, and the polysilicon layer is provided with an opening at a region corresponding to the third dielectric layer, so as to expose the top surface of the third dielectric layer. In a case that the fifth layer and the polysilicon layer are made of the same material, the fifth layer may be obtained by filling the groove between the inner wall of the fourth dielectric layer when the polysilicon layer being fabricated. Thereby, the fifth layer and the polysilicon layer are fabricated in a same process. A fabrication process of the shallow trench isolation structure is simplified, and a fabrication cost is reduced.

It should be noted that in another embodiment, the fifth layer and the polysilicon layer may be separately fabricated in the case that the fifth layer and the polysilicon layer are made of the same material. The present disclosure is not limited thereto.

Reference is made to FIGS. 1 to 5. In one embodiment, the top surface of the third dielectric layer 230 is recessed, and a bottom of the recessed top surface of the third dielectric layer is lower than the topmost surface of the second dielectric layer 220.

Correspondingly, a semiconductor device is further provided according to an embodiment of the present disclosure. The semiconductor device may be a semiconductor memory, which is not limited herein. The semiconductor device includes the shallow trench isolation structure according to any aforementioned embodiment. Reference is made to FIG. 1. The semiconductor device according to an embodiment of the present disclosure includes: a substrate 100; at least one trench 110 in the substrate 100; and a first dielectric layer 210, a second dielectric layer 220 and a third dielectric layer 230 that are sequentially stacked on an inner wall of each of the at least one trench 110. A topmost surface of the first dielectric layer 210 is lower than a topmost surface of the second dielectric layer 220 and the top surface of the substrate 100, to form a first groove 211 between the second dielectric layer 220 and the substrate 100. An edge corner between the top surface of the substrate 100 and the inner wall of each of the at least one trench 110 is in a shape of a fillet curve 120.

In one embodiment, a first dielectric layer and a second dielectric layer that are flush at the top may be formed in fabricating the shallow trench isolation structure of the semiconductor device. Then, the topmost surface of the first dielectric layer is etched to form the first groove. The edge corner between the top surface of the substrate and the inner wall of each trench may also be etched in etching the first dielectric layer, so that the first groove and the fillet curve at the edge corner between the top surface of the substrate and the inner wall of each trench are fabricated in a same process. Thereby, a fabrication process can be simplified, and a fabrication cost can be reduced.

It should be noted that herein a process of fabricating the fillet structure of the edge corner between the top surface of the substrate and the inner wall of each trench is not limited to the aforementioned process. In another of the present disclosure, the first groove and the fillet curve at the edge corner between the top surface of the substrate and the inner wall of each trench may be separately fabricated. The present disclosure is not limited thereto, and a specific process may be designed according to a practical application.

In one embodiment, the topmost surface of the first dielectric layer 210, the topmost surface of the second dielectric layer 220, and a top surface of the third dielectric layer 230 are all lower than the top surface of the substrate 100. The present disclosure is not limited thereto.

According to embodiments of the present disclosure, an edge of the trench at the top surface of the substrate is a fillet structure, so that such edge is smooth and round without a sharp corner. Thereby, point discharge of the shallow trench isolation structure is reduced at an edge on the top surface of the substrate, and reliability of the shallow trench isolation structure is improved.

In one embodiment, the substrate may be a silicon substrate, the first dielectric layer may be an oxide dielectric layer, the second dielectric layer may be a nitride dielectric layer, and the third dielectric layer may be an oxide dielectric layer. The present disclosure is not limited thereto. In another embodiment, the substrate, the first dielectric layer, the second dielectric layer, and the third dielectric layer may be made of other materials.

Reference is made to FIG. 2, which is a schematic cross-sectional view of another shallow trench isolation structure according to an embodiment of the present disclosure. The semiconductor device in one embodiment further includes a fourth dielectric layer 240 located on an inner wall of the first groove 211.

The fourth dielectric layer is formed along the inner wall of the first groove in the shallow trench isolation structure of the semiconductor device. Since the first groove is located at the edge corner between the top surface of the substrate and the inner wall of each trench, the fourth dielectric layer is overlapped with the edge corner. Thereby, the fourth dielectric layer covers at least a part of the edge corner between the top surface of the substrate and the inner wall of each trench. The point discharge of the shallow trench isolation structure is further reduced at the edge on the top surface of the substrate, and the reliability of the shallow trench isolation structure is further improved.

Reference is further made to FIG. 3, which is a schematic cross-sectional view of another shallow trench isolation structure according to an embodiment of the present disclosure. The fourth dielectric layers 240 of adjacent trenches 110 abut with each other, covering the top surface of the substrate 100.

In one embodiment, the fourth dielectric layer may be a gate oxide layer. The present disclosure is not limited thereto. In another embodiment, the fourth dielectric layer may be made of polysilicon.

The fourth dielectric layer covers the top surface of the substrate between the adjacent trenches when being fabricated in the first groove, and thereby it is not necessary to separately fabricate a dielectric layer covering the top surface of the substrate. A fabrication process of the shallow trench isolation structure in the semiconductor device is simplified, and a fabrication cost is reduced.

It should be noted that, in another embodiment, the fourth dielectric layer and the dielectric layer on the top surface of the substrate may be separately fabricated. The present disclosure is not limited thereto, and a specific process may be designed according to a practical application.

Reference is made to FIG. 4, which is a schematic cross-sectional view of another shallow trench isolation structure according to an embodiment of the present disclosure. The semiconductor device further includes a fifth layer 250 at the first groove 211, and the fifth layer 250 is located in a groove formed by an inner wall of the fourth dielectric layer 240.

It can be seen from the shallow trench isolation structure of the semiconductor device as shown in FIG. 4, that the fifth layer and the second dielectric layer may be made of a same material. Alternatively, the fifth layer may be made of a different material. Reference is made to FIG. 5, which is a schematic cross-sectional view of another shallow trench isolation structure according to an embodiment of the present disclosure. The semiconductor further includes a polysilicon layer 300 located on a side away from the substrate of the fourth dielectric layer 240. The fifth layer 250 and the polysilicon layer 300 are made of a same material.

In one embodiment, the shallow trench isolation structure includes the polysilicon layer located on the side facing away from the substrate of the fourth dielectric layer, and the polysilicon layer may cover the topmost surface of the second dielectric layer and a part of the top surface of the third dielectric layer. Namely, the polysilicon layer covers the topmost surface of the second dielectric layer, and is provided with an opening at a region corresponding to the third dielectric layer, so as to expose another part of the top surface of the third dielectric layer (where the exposed part may correspond to a central region of the third dielectric layer). In a case that the fifth layer and the polysilicon layer are made of the same material, the fifth layer may be obtained by filling the groove between the inner wall of the fourth dielectric layer when the polysilicon layer being fabricated. Thereby, the fifth layer and the polysilicon layer are fabricated in a same process. A fabrication process of the shallow trench isolation structure is simplified, and a fabrication cost is reduced.

In one embodiment, the polysilicon layer may be a layer structure with a uniform thickness, as shown in FIG. 5. In one embodiment, a surface of the polysilicon layer 300 above the trench 110 is lower than a surface of the polysilicon layer above the top surface of the substrate 100.

It should be noted that in another embodiment, the fifth layer and the polysilicon layer may be separately fabricated in the case that the fifth layer and the polysilicon layer are made of the same material. The present disclosure is not limited thereto.

A position of the shallow trench isolation structure in the semiconductor device is not limited herein. For different positions of the shallow trench isolation structure in a semiconductor device, a corresponding structure of the shallow trench isolation structure is also different. In one embodiment, the semiconductor device includes a functional film layer above the substrate. The functional film layer may be a stacked structure. The functional film layer may be located at a surface facing away from the substrate of fourth dielectric layer. The functional film layer may be located on a surface facing away from the substrate of the polysilicon layer. The present disclosure is not limited thereto. In one embodiment, the stacked structure may include at least a second wiring layer and a hard mask layer that are sequentially stacked above the substrate in the semiconductor device. The stacked structure is provided with an opening exposing at least a part of the top surface of the third dielectric layer.

Figure 6:
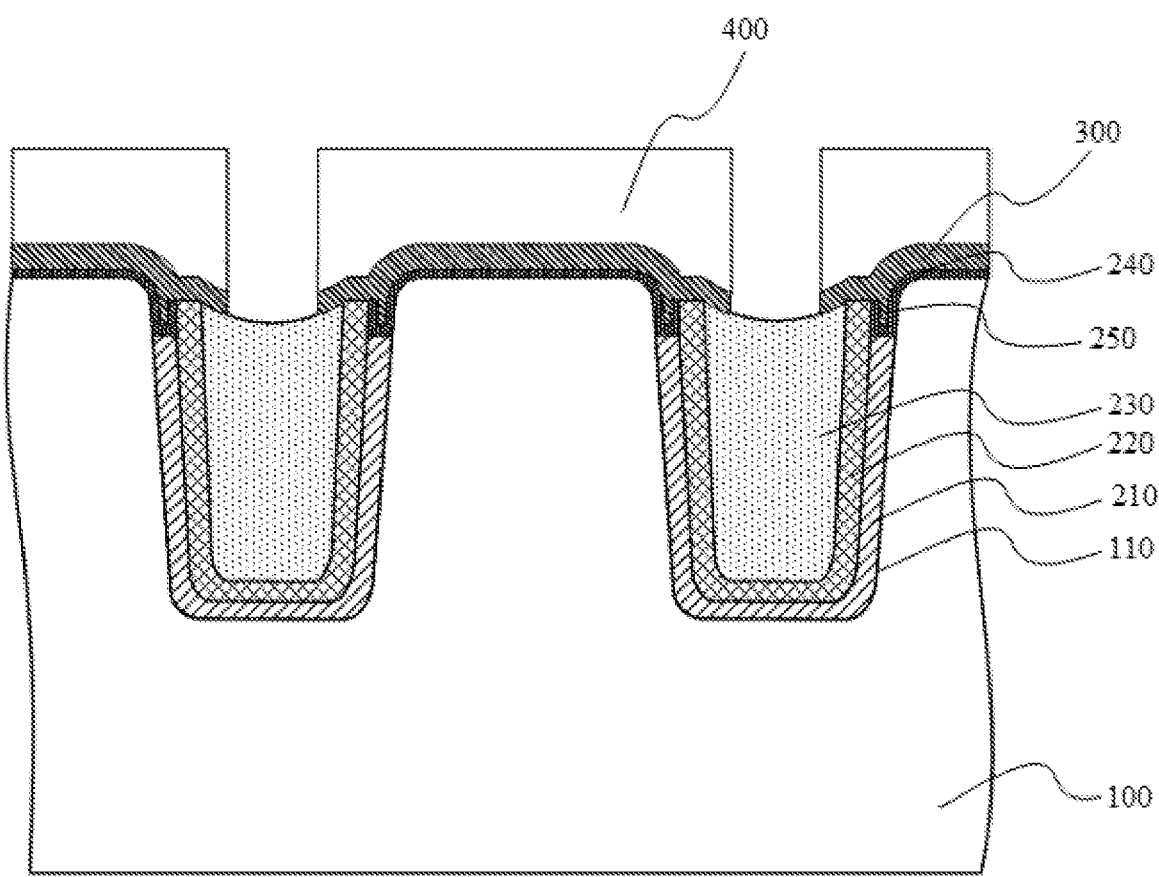
FIG. 6 is a schematic cross-sectional view of a semiconductor device according to an embodiment of the present disclosure.

Hereinafter a technical solution is specifically described with the functional film layer being located at the surface facing away from the substrate of the polysilicon layer. Reference is made to FIG. 6, which is a schematic cross-sectional view of a semiconductor device according to an embodiment of the present disclosure. In a case that the polysilicon layer 300 is provided in the shallow trench isolation structure on the side facing away from the substrate of the fourth dielectric layer 240, the functional film layer 400 is further fabricated on the side facing away from the substrate 100 of the polysilicon layer 300. The functional film layer 400 is provided with an opening corresponding to the third dielectric layer 230.

The fourth dielectric layers 240 at the adjacent trenches 110 may abut with each other covering the top surface of the substrate 100, and the polysilicon layers 300 at the adjacent trenches 110 may abut with each other, covering a region corresponding to the top surface of the substrate 100, as shown in FIG. 6. Thereby, the polysilicon layer 300 in this embodiment may cover the fourth dielectric layer 240 and extends to the top surface of the third dielectric layer 230 in the adjacent trench 110, and the polysilicon layer 300 is provided with the opening at a region corresponding to the third dielectric layer 230. Further, the functional film layer 400 is located on the side facing away from the substrate 100 of the polysilicon layer 300. The functional film layer 400 may cover the polysilicon layer 300, and the functional film layer 400 is also provided with an opening at the region corresponding to the third dielectric layer 230. Namely, the functional film layer 400 may bridge between the adjacent two trenches 110 to connect them.

In another embodiment, for a different position of the shallow trench isolation structure in the semiconductor device, a structure of the functional film layer is also different.

Figure 7:
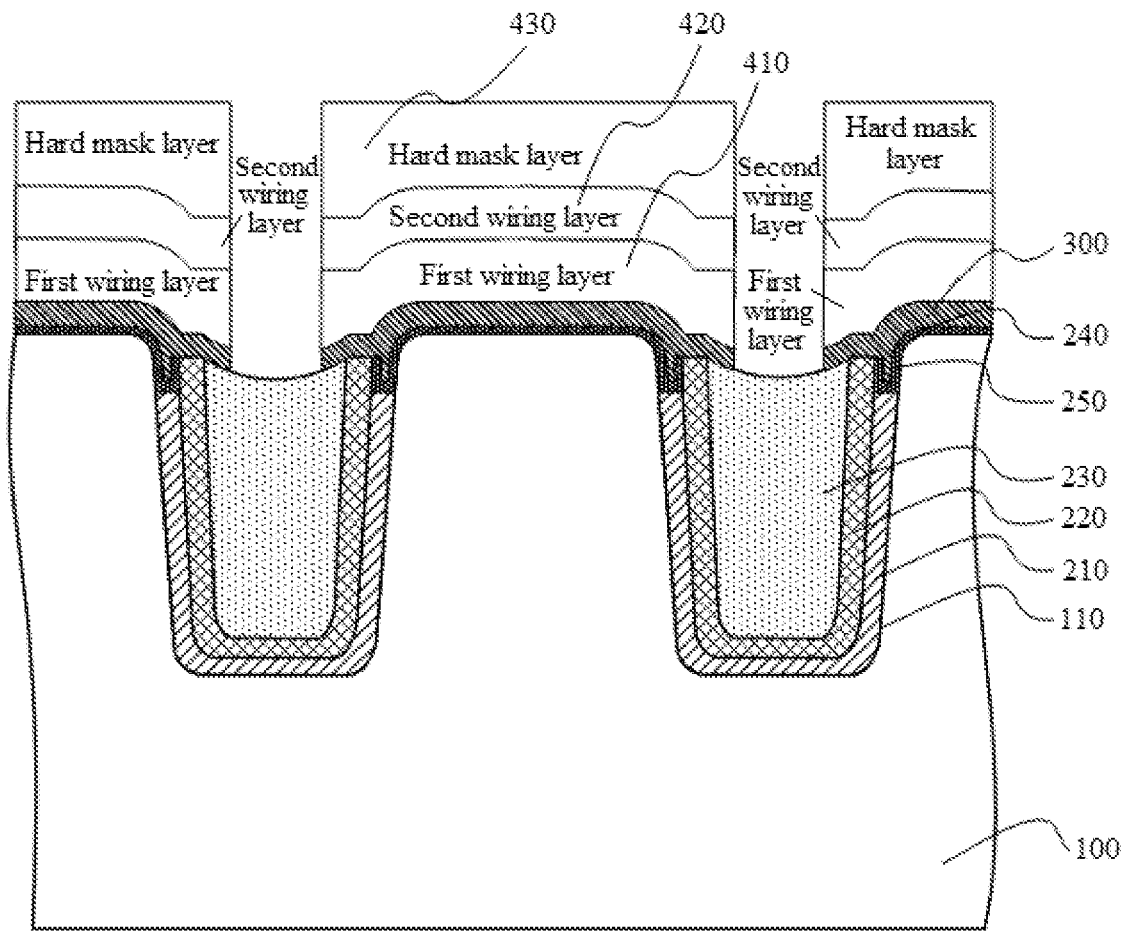
FIG. 7 is a schematic cross-sectional view of another semiconductor device according to an embodiment of the present disclosure.

In one embodiment, the first wiring layer, the second wiring layer, and the hard mask layer are sequentially stacked on the side facing away from the substrate of the polysilicon layer. The first wiring layer, the second wiring layer, and the hard mask layer are provided with a same opening as that for the polysilicon layer. Reference is made to FIG. 7, which is a schematic cross-sectional view of another semiconductor device according to an embodiment of the present disclosure. The functional film layer in one embodiment may at least include the first wiring layer 410, the second wiring layer 420 and the hard mask layer 430 that are sequentially stacked, from the polysilicon layer 300. A material of the first wiring layer 410 may include, but is not limited to, titanium or titanium nitride. A material of the second wiring layer 420 may be metal (such as tungsten). A material of the hard mask layer 430 may include, but not limited to, a nitride.

In one embodiment, a surface of the first wiring layer above the trench is lower than a surface of the first wiring layer above the top surface of the substrate. Surfaces facing away from the substrate of the hard mask layers are coplanar.

As shown in FIG. 7, the polysilicon layer 300 in one embodiment has a uniform thickness. The topmost surface of the first dielectric layer 210, the topmost surface of the second dielectric layer 220, and the top surface of the third dielectric layer 230 each is lower than the top surface of the substrate 100 at the trench 110. Thereby, the surface facing away from the substrate 100 of the polysilicon layer 300 is not planar, and in a shape that a part above the trench 110 is lower than a part above the top surface of the substrate 100. Moreover, both the first wiring layer 410 and the second wiring layer 420 may be a layer structure with a uniform thickness. Thereby, each surface facing away from the substrate 100, of the first wiring layer 410 and the second wiring layer 420, are in a shape that a part above the trench 110 is lower than a part above the top surface of the substrate 100. In one embodiment, the hard mask layer 430 may be a planarized layer, and the surfaces of the hard mask layers facing away from the substrate 100 may be coplanar. The present disclosure is not limited thereto.

Figure 8:
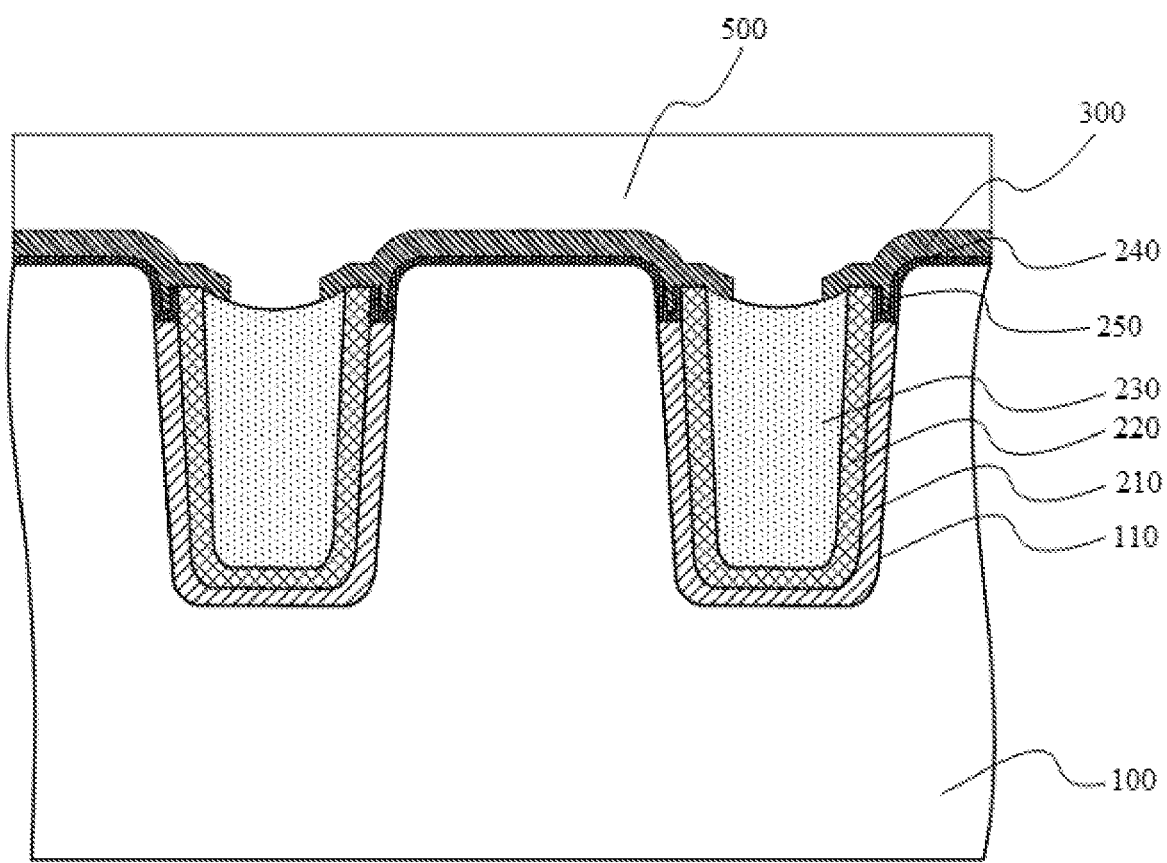
FIG. 8 is a schematic cross-sectional view of another semiconductor device according to an embodiment of the present disclosure.

Reference is made to FIG. 8, which is a schematic cross-sectional view of another semiconductor device according to an embodiment of the present disclosure. In one embodiment, a filling layer 500 may obtained by directly filling at a side facing away from the substrate 100 of the fourth dielectric layer 240 in the semiconductor device. A material of the filling layer 500 may include, but is not limited to, an oxide.

It should be noted that what is shown in FIGS. 6 to 8 are only several of all the structures that may be applied at the shallow trench isolation structure according to embodiments of the present disclosure. The present disclosure is not limited thereto. A specific design is based on a type of the semiconductor device and a position of the shallow trench isolation structure in the semiconductor device.

Reference is made to FIGS. 1 to 8. In one embodiment, the top surface of the third dielectric layer 230 is recessed, and a bottom of the recessed top surface of the third dielectric layer 230 is lower than the topmost surface of the second dielectric layer 220.

The shallow trench isolation structure and the semiconductor device are provided according to embodiments of the disclosure, including: the substrate; the at least one trench in the substrate; and the first dielectric layer, the second dielectric layer and the third dielectric layer that are sequentially stacked on the inner wall of each of the at least one trench. The topmost surface of the first dielectric layer is lower than the topmost surface of the second dielectric layer and the top surface of the substrate, to form the first groove between the second dielectric layer and the substrate. The edge corner between the top surface of the substrate and the inner wall of each of the at least one trench is in the shape of the fillet curve. It can be seen that according to the aforementioned technical solutions, an edge of the trench at the top surface of the substrate is a fillet structure, so that such edge is smooth and round without a sharp corner. Thereby, point discharge at the shallow trench isolation structure is reduced, and reliability of the shallow trench isolation structure is improved.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

What is claimed is:
1. A shallow trench isolation structure, comprising:
a substrate;
at least one trench in the substrate;
a first dielectric layer, a second dielectric layer and a third dielectric layer that are sequentially stacked on an inner wall of each of the at least one trench;
a first groove between the second dielectric layer and the substrate, wherein a topmost surface of the first dielectric layer is lower than a topmost surface of the second dielectric layer and a topmost surface of the substrate; and
a fourth dielectric layer, located at a surface of an inner wall of the first groove; and a fifth layer at the first groove, wherein the fifth layer is located in a groove formed by an inner wall of the fourth dielectric layer;

wherein a topmost surface of the fifth layer is lower than the topmost surface of the substrate.

2. The shallow trench isolation structure according to claim 1, wherein an edge corner between the topmost surface of the substrate and the inner wall of each of the at least one trench is in a shape of a fillet curve.

3. The shallow trench isolation structure according to claim 1, wherein the fourth dielectric layer at adjacent ones of the at least one trenches abut with each other, covering the topmost surface of the substrate.

4. The shallow trench isolation structure according to claim 1, wherein the fifth layer and the second dielectric layer are made of a same material.

5. The shallow trench isolation structure according to claim 1, further comprising:

a polysilicon layer located on a side away from the substrate of the fourth dielectric layer, wherein:

a polysilicon layer covers the topmost surface of the second dielectric layer and the topmost surface of the fifth layer, and the polysilicon layer is discontinuous and exposes a central part of a top surface of the third dielectric layer, in a direction perpendicular to a direction along which the at least one trench extends.

6. The shallow trench isolation structure according to claim 1, wherein a top surface of the third dielectric layer is recessed, and a bottom of the recessed top surface of the third dielectric layer is lower than the topmost surface of the second dielectric layer.

7. The shallow trench isolation structure according to claim 5, wherein the polysilicon layer and the fifth layer are made of a same material.

8. The shallow trench isolation structure according to claim 7, wherein a topmost surface of the polysilicon layer above the at least one trench is lower than a topmost surface of the polysilicon layer above the topmost surface of the substrate.

9. A semiconductor device, comprising:
a substrate;
at least one trench in the substrate;
a first dielectric layer, a second dielectric layer and a third dielectric layer that are sequentially stacked on an inner wall of each of the at least one trench;
a first groove between the second dielectric layer and the substrate, wherein a topmost surface of the first dielectric layer is lower than a topmost surface of the second dielectric layer and a topmost surface of the substrate;
a fourth dielectric layer, located a surface of an inner wall of the first groove; and
a fifth layer at the first groove, wherein the fifth layer is located in a groove formed by an inner wall of the fourth dielectric layer;
wherein a topmost surface of the fifth layer is lower than the topmost surface of the substrate.

10. The semiconductor device according to claim 9, wherein:

an edge corner between the topmost surface of the substrate and the inner wall of each of the at least one trench is in a shape of a fillet curve.

11. The semiconductor device according to claim 9, wherein the fourth dielectric layer adjacent ones of the at least one trenches abut with each other, covering the topmost surface of the substrate.

12. The semiconductor device according to claim 9, wherein the fifth layer and the second dielectric layer are made of a same material.

13. The semiconductor device according to claim 9, further comprising:

a polysilicon layer located on a side away from the substrate of the fourth dielectric layer, wherein the polysilicon layer covers the topmost surface of the second dielectric layer and the topmost surface of the fifth layer, and the polysilicon layer is discontinuous and exposes a central part of a top surface of the third dielectric layer, in a direction perpendicular to a direction along which the at least one trench.

14. The semiconductor device according to claim 13, wherein the polysilicon layer and the fifth layer are made of a same material.

15. The semiconductor device according to claim 14, wherein a topmost surface of the polysilicon layer above the at least one trench is lower than a topmost surface of the polysilicon layer above the topmost surface of the substrate.

16. The semiconductor device according to claim 14, wherein the polysilicon layers at adjacent ones of the at least one trench abut with each other, covering a corresponding region of the topmost surface of the substrate.

17. The semiconductor device according to claim 9, wherein the top surface of the third dielectric layer is recessed, and a bottom of the recessed top surface of the third dielectric layer is lower than the topmost surface of the second dielectric layer.

18. The semiconductor device according to claim 9, further comprising at least one stacked structure, wherein:

each of the at least one stacked structure comprises at least a first wiring layer, a second wiring layer, and a hard mask layer that are sequentially stacked above the substrate; and each of the at least one stacked structure is provided with an opening exposing at least a part of a top surface of the third dielectric layer.

19. The semiconductor device according to claim 18, wherein:

a topmost surface of the first wiring layer above the at least one trench is lower than a topmost surface of the first wiring layer above the topmost surface of the substrate; and a surface facing away from the substrate of the hard mask layer is coplanar among the at least one stacked structure.

* * * * *